United States Patent
Sestok et al.

(10) Patent No.: US 8,094,050 B2
(45) Date of Patent: *Jan. 10, 2012

(54) BANDWIDTH MISMATCH ESTIMATION IN TIME-INTERLEAVED ANALOG-TO-DIGITAL CONVERTERS

(75) Inventors: Charles K. Sestok, Dallas, TX (US); Fernando A. Mujica, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/032,407

(22) Filed: Feb. 22, 2011

(65) Prior Publication Data

US 2011/0193732 A1   Aug. 11, 2011

Related U.S. Application Data

(63) Continuation of application No. 12/572,831, filed on Oct. 2, 2009, now Pat. No. 7,916,051.

(51) Int. Cl.
  *H03M 1/10* (2006.01)
(52) U.S. Cl. ........................ 341/120; 341/155
(58) Field of Classification Search .................. 341/120, 341/155, 118, 122, 159
  See application file for complete search history.

(56) References Cited

U.S. PATENT DOCUMENTS

| | | | |
|---|---|---|---|
| 6,100,835 A * | 8/2000 | Hamilton | 341/155 |
| 6,396,429 B2 * | 5/2002 | Singer et al. | 341/155 |
| 6,483,448 B2 * | 11/2002 | Martin et al. | 341/123 |
| 6,873,281 B1 * | 3/2005 | Esterberg et al. | 341/163 |
| 7,099,422 B2 * | 8/2006 | Hoctor et al. | 375/354 |
| 7,778,320 B2 * | 8/2010 | Agazzi et al. | 375/229 |
| 7,782,235 B1 * | 8/2010 | Velazquez | 341/118 |
| 2005/0190089 A1 * | 9/2005 | Draxelmayr et al. | 341/141 |
| 2007/0133722 A1 * | 6/2007 | Agazzi et al. | 375/346 |

OTHER PUBLICATIONS

"Bandwidth Mismatch Correction for a Two-Channel Time-Interleaved A/D/ Converter," Proceedings of 200 IEEE International Symposium on Circuits and Systems, pp. 1705-1708 (Satarzadeh, et al). Bandwidth Mismatch and Its Correction in Time-Interleaved Analog-to-Digital Converters, IEEE Transactionson on Circuits and Systems—II: Express Briefs, vol. 53, No. Oct. 2006, p. 1133-1137 (Tsai, et al.).

* cited by examiner

*Primary Examiner* — Peguy Jean Pierre
(74) *Attorney, Agent, or Firm* — John J. Patti; Wade J. Brady, III; Frederick J. Telecky, Jr.

(57) ABSTRACT

With high speed, high resolution time-interleaved (TI) analog-to-digital converters (ADCs), bandwidth mismatches between the various ADC branches can pose a significant problem. Previously, though, no adequate solution has been found. Here, a method and apparatus are provided that can calculate and compensate for bandwidth mismatches in a TI ADC, enabling a high speed, high resolution TI ADC to be produced.

13 Claims, 8 Drawing Sheets

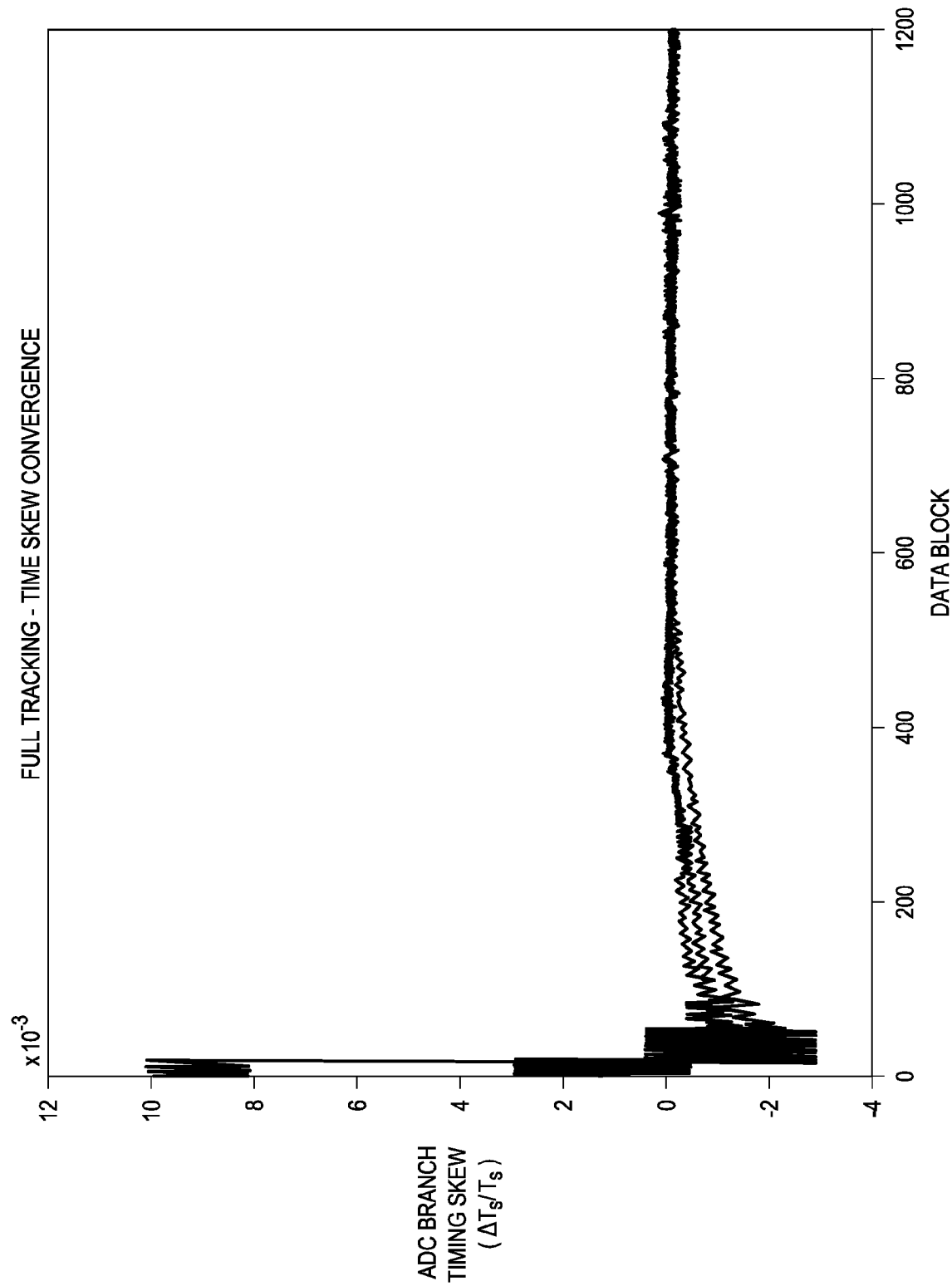

BANDWIDTH MISMATCH ESTIMATION IN TIME-INTERLEAVED ANALOG-TO-DIGITAL CONVERTERS

CROSS-REFERENCE TO RELATED APPLICATIONS

This application is a continuation of U.S. patent application Ser. No. 12/572,831, entitled "BANDWIDTH MISMATCH ESTIMATION IN TIME-INTERLEAVED ANALOG-TO-DIGITAL CONVERTERS," filed on Oct. 2, 2009, which is hereby incorporated by reference for all purposes.

TECHNICAL FIELD

The invention relates generally to analog-to-digital converters (ADCs) and, more particularly, to time-interleaved (TI) ADCs.

BACKGROUND

Referring to FIG. 1 of the drawings, the reference numeral 100 generally designates a conventional analog-to-digital converter (ADC). ADC 100 generally comprises a track-and-hold (T/H) circuit 102 and a sub-ADC 104 so that, in operation, the ADC 100 can sample an analog input signal X(t) at a plurality of sampling instants and convert the sampled signal into a digital signal Y[n]. As is shown in FIG. 1, though, the T/H circuit 104 generally comprises switches and capacitors, which causes the T/H circuit 102 to function as a filter (typically a single pole filter).

Turning to FIG. 2, a model 200 of the ADC 100 is shown. In model 200, the filter aspects of the ADC 100 are represented by filter 202, while the remainder of the functionality of the ADC 100 is represented by ideal ADC 204. Filter 202 has a transfer function in the time-domain of $h_a(t)$, which can, in turn, be represented in the frequency-domain as:

$$H_a(\omega) = \frac{g_a e^{i\omega \Delta t}}{1 + i\left(\frac{\omega}{\omega_a}\right)}, \quad (1)$$

where $g_a$ is the gain of ADC 100, $\Delta t_a$ is the time delay relative to a reference, and $\omega_a$ is the cutoff frequency (bandwidth). This model 200 can be useful when determining mismatches for time-interleaved (TI) ADCs.

In FIG. 3A, an example of a TI ADC 300 can be seen. TI ADC 300 generally comprises ADCs 100-0 to 100-(M−1) (where each of ADCs 100-0 to 100-(M−1) generally has the same structure as ADC 100 from FIG. 1) that are clocked by divider 302 so that the outputs from ADCs 100-0 to 100-(M−1) can be multiplexed by multiplexer 304 to produce digital signal Y[n]. Yet, when building TI ADC 300, ADCs 100-0 to 100-(M−1) are not identical to each other; there are slight structural and operational variations. These slight variations result in Direct Current (DC) offset mismatches, timing skew, gain mismatches, and bandwidth mismatches between ADCs 100-0 to 100-(M−1).

Of the different types of mismatches listed, bandwidth mismatches are the weakest, and, to date, have largely been ignored, but, in order to build a high accuracy (generally greater than 6 bits), high speed (generally greater than 1 GS/s) TI ADCs, bandwidth mismatches between interleaved ADC branches need to be corrected. Looking to TI ADC 300, the output spectrum when the input signal is a tone with frequency $\omega_*$ can be represented as follows:

$$Y(e^{i\omega}) = \sum_{k=0}^{M-1} \left( \frac{1}{M} \sum_{a=0}^{M-1} H_a(\omega_*) e^{-i\frac{2\pi k}{M}a} \right) \delta\left(\omega - \omega_* - \frac{2\pi k}{M}\right). \quad (2)$$

Assuming a 2-way TI ADC (M=2), which generally represents the upper-bound or worst-case for bandwidth mismatch, equation (2) can be reduced to:

$$Y(e^{i\omega}) = \left(\frac{H_0(\omega_0) + H_1(\omega_0)}{2}\right) X(e^{i\omega}) + \left(\frac{H_0(\omega_0) - H_1(\omega_0)}{2}\right) X(e^{i(\omega-\pi)}) \quad (3)$$

with a Spurious-Free Dynamic Range (SFDR) of $$SFDR = 20\log_{10}\left(\frac{H_0(\omega_0) + H_1(\omega_0)}{H_0(\omega_0) - H_1(\omega_0)}\right) \quad (4)$$

The SFDR for an M-way interleaved TI ADC, therefore, can then be determined to be:

$$SFDR = \max_k \left( 20\log_{10}\left(\frac{A[0]}{A[k]}\right) \right) \quad (5)$$

where $$A[k] = \sum_{a=0}^{M-1} H_a(\omega_0) e^{-i\frac{2\pi k}{M}a} \quad (6)$$

Now, equation (1) can be applied to TI ADC 300 for the purposes of simulation so $$H_a(\omega_0) = \frac{1}{1 + i\tau_a \omega_0}, \text{ for } T_S > \tau_a = \frac{1}{\omega_a}, \quad (7)$$

where $T_S$ is the period of clock signal CLK. Such a simulation yields that variations in bandwidth mismatches are dependent on gain mismatches and timing skews and that (with high accuracy, high speed TI ADCs) bandwidth mismatch can significantly affect performance. An example of a simulation of the effect bandwidth mismatch can be seen in FIG. 3B for different gain and skew compensations. Thus, to achieve the desired SFDR (i.e., greater than 70 dB) for a TI ADC, the bandwidths of ADCs within the TI ADC should be matched to be within 0.1% to 0.25%.

To date, however, no estimation algorithm or circuit exists to blindly determine bandwidth mismatches. The two most relevant conventional circuits, though, are described in the following: Satarzadeh et al., "Bandwidth Mismatch Correction for a Two-Channel Time-Interleaved A/D Converter," *Proceedings of 2007 IEEE International Symposium on Circuits and Systems*, 2007; and Tsai et al., "Bandwidth Mismatch and Its Correction in Time-Interleaved Analog-to-Digital Converters," *IEEE Transactions on Circuits and Systems II: Express Briefs*, Vol. 53, No. 10, pp. 1133-1137, Oct. 23, 2006. Neither of these circuits, though, adequately addresses blind bandwidth mismatch estimation, indicating a need for an apparatus and/or method to determine and compensate for bandwidth mismatches.

SUMMARY

A preferred embodiment of the present invention, accordingly, provides an apparatus. The apparatus comprises a plurality of analog-to-digital converter (ADC) branches, wherein each ADC branch receives an analog input signal, and wherein each ADC branch has an autocorrelation sequence that is estimated by an autocorrelation estimator, and wherein each ADC branch has an ADC that includes: a track-and-hold (T/H) circuit that receives the analog input signal and that has filter characteristics, wherein the filter characteristics are adjustable; and a sub-ADC that is coupled to the T/H circuit; a multiplexer that is coupled to each of the ADC branches; and a mismatch estimation circuit that is coupled to each T/H circuit and that receives an output signal from each ADC branch, wherein the mismatch estimation circuit adjusts the filter characteristics for each T/H circuit to determine a desired range for a cost function over a plurality of samples of the analog input signal.

In accordance with a preferred embodiment of the present invention, each ADC branch includes an amplifier that is coupled to its corresponding ADC.

In accordance with a preferred embodiment of the present invention, the mismatch estimation circuit adjusts the gain for each amplifier to determine the desired range for the cost function over the plurality of samples of the analog input signal.

In accordance with a preferred embodiment of the present invention, the cost function (V) is:

$$V = \sum_{l} |\hat{R}_{aa}[lMT_S] - \hat{R}_{00}[lMT_S]|,$$

wherein $\hat{R}_{aa}$ denotes the estimate for the autocorrelation sequence for the $a^{th}$ ADC branch, M denotes the number of ADC branches, and $T_S$ is a sampling clock period.

In accordance with a preferred embodiment of the present invention, the apparatus further comprises a divider that receives a clock signal and that is coupled to each ADC branch.

In accordance with a preferred embodiment of the present invention, each ADC branch further comprises an adjustable delay element that is coupled to each ADC, to the divider, and to the mismatch estimation circuit, wherein the mismatch estimation circuit adjusts each delay element to compensate for timing skews.

In accordance with a preferred embodiment of the present invention, the cost function (V) is:

$$V = \sum_{l} \left( \frac{\hat{R}_{aa}[lMT_S]}{\hat{R}_{aa}[fMT_S]} - \frac{\hat{R}_{00}[lMT_S]}{\hat{R}_{00}[fMT_S]} \right)^2,$$

wherein $\hat{R}_{aa}$ denotes the estimate for the autocorrelation sequence for the $a^{th}$ ADC branch, M denotes the number of ADC branches, f is an arbitrary delay, and $T_S$ is a sampling clock period.

In accordance with a preferred embodiment of the present invention, an apparatus is provided. The apparatus comprises a plurality of ADC branches, wherein each ADC branch receives an analog input signal, and wherein each ADC branch has an autocorrelation sequence that is estimated by an autocorrelation estimator, and wherein each ADC branch has an ADC that includes: a T/H circuit that receives the analog input signal and that has filter characteristics, wherein the filter characteristics are adjustable; and a sub-ADC that is coupled to the T/H circuit; a multiplexer that is coupled to each of the ADC branches; a mismatch estimation circuit that is coupled to each T/H circuit and that receives an output signal from each ADC branch, wherein the mismatch estimation circuit has a computer program embodied thereon that includes: computer code for squaring an error between the estimate for the autocorrelation sequence of a first ADC branch of the plurality of ADC branches and the estimates for the autocorrelation sequences for the remainder of the ADC branches as a cost function; and computer code for adjusting each of the T/H circuits to compensate for bandwidth mismatches.

In accordance with a preferred embodiment of the present invention, each ADC branch further comprises a Direct Current (DC) offset circuit that is coupled to its corresponding ADC.

In accordance with a preferred embodiment of the present invention, a method for bandwidth matching a plurality of ADC branches in a time-interleaved (TI) ADC is provided. The method comprises sampling an analog input signal at a plurality of sampling instants by the plurality of ADC branches; calculating an autocorrelation sequence for each ADC branch, wherein each ADC branch includes an T/H circuit; calculating a cost function to determine bandwidth mismatches for the plurality of ADC branches, wherein the cost function is a function of the autocorrelation sequences of the plurality of ADC branches; and adjusting at least one of the T/H circuits from the plurality of ADC branches based at least in part on the cost function to substantially bandwidth match the plurality of ADC branches.

In accordance with a preferred embodiment of the present invention, each autocorrelation sequence estimate is $$\hat{R}_{aa}[lMT_S] = \frac{1}{L}\sum_{k=0}^{L-1} x[kMT_S + a]x[(k-l)MT_S + a]$$

for the $a^{th}$ ADC branch, wherein M denotes the number of ADC branches and $T_S$ is a sampling clock period.

In accordance with a preferred embodiment of the present invention, the cost function (V) is a distance metric defined on the sequences $\hat{R}_{aa}[lMT_S]$ and $\hat{R}_{00}[lMT_S]$.

In accordance with a preferred embodiment of the present invention, the cost function (V) is a distance metric defined on the sequences $$\frac{\hat{R}_{aa}[lMT_S]}{\hat{R}_{aa}[fMT_S]} \text{ and } \frac{\hat{R}_{00}[lMT_S]}{\hat{R}_{00}[fMT_S]},$$

for an arbitrary delay f.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A through 6D are graphs depicting the operation of the TI ADC of FIG. 4.

DETAILED DESCRIPTION

Figure 1:
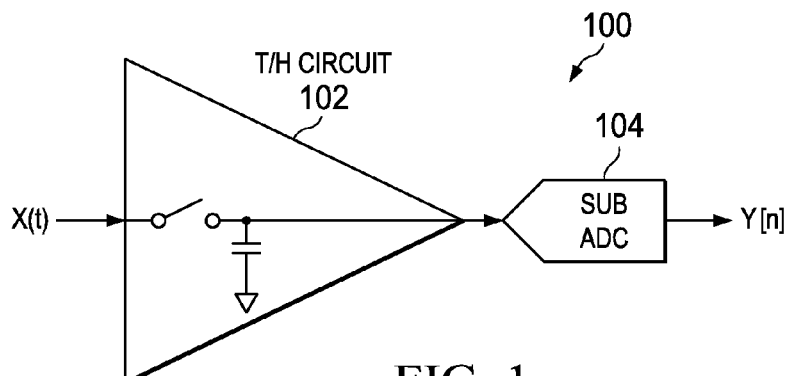
FIG. 1 is a circuit diagram of a conventional analog-to-digital converter (ADC)
Figure 2:
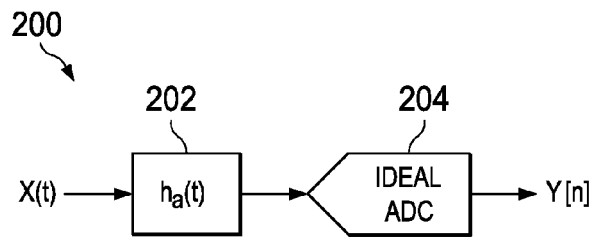
FIG. 2 is a block diagram of a model of the ADC of FIG. 1.
Figure 3A:
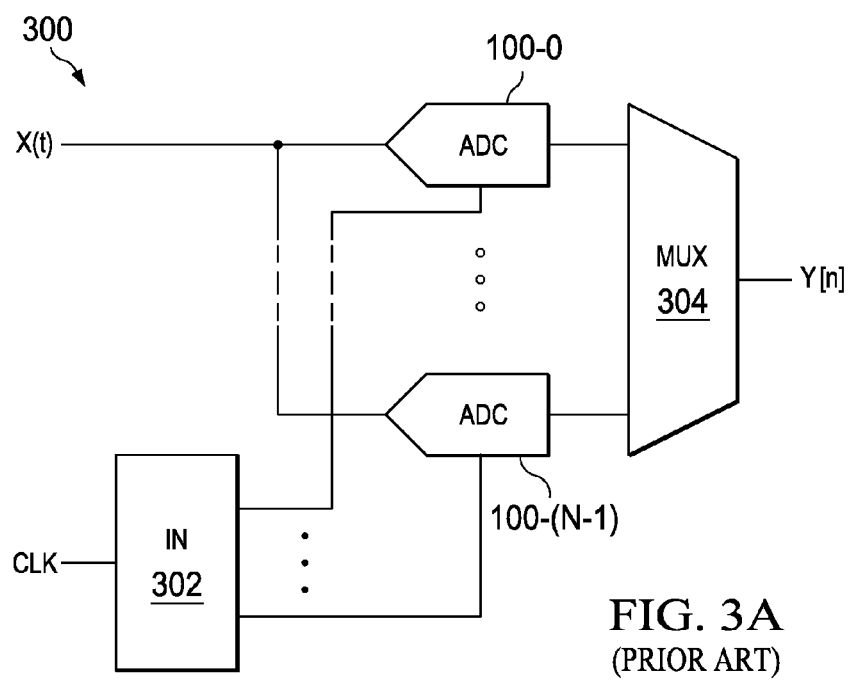
FIG. 3A is a circuit diagram of a convention time-interleaved (TI) ADC using the ADC of FIG. 1.
Figure 3B:
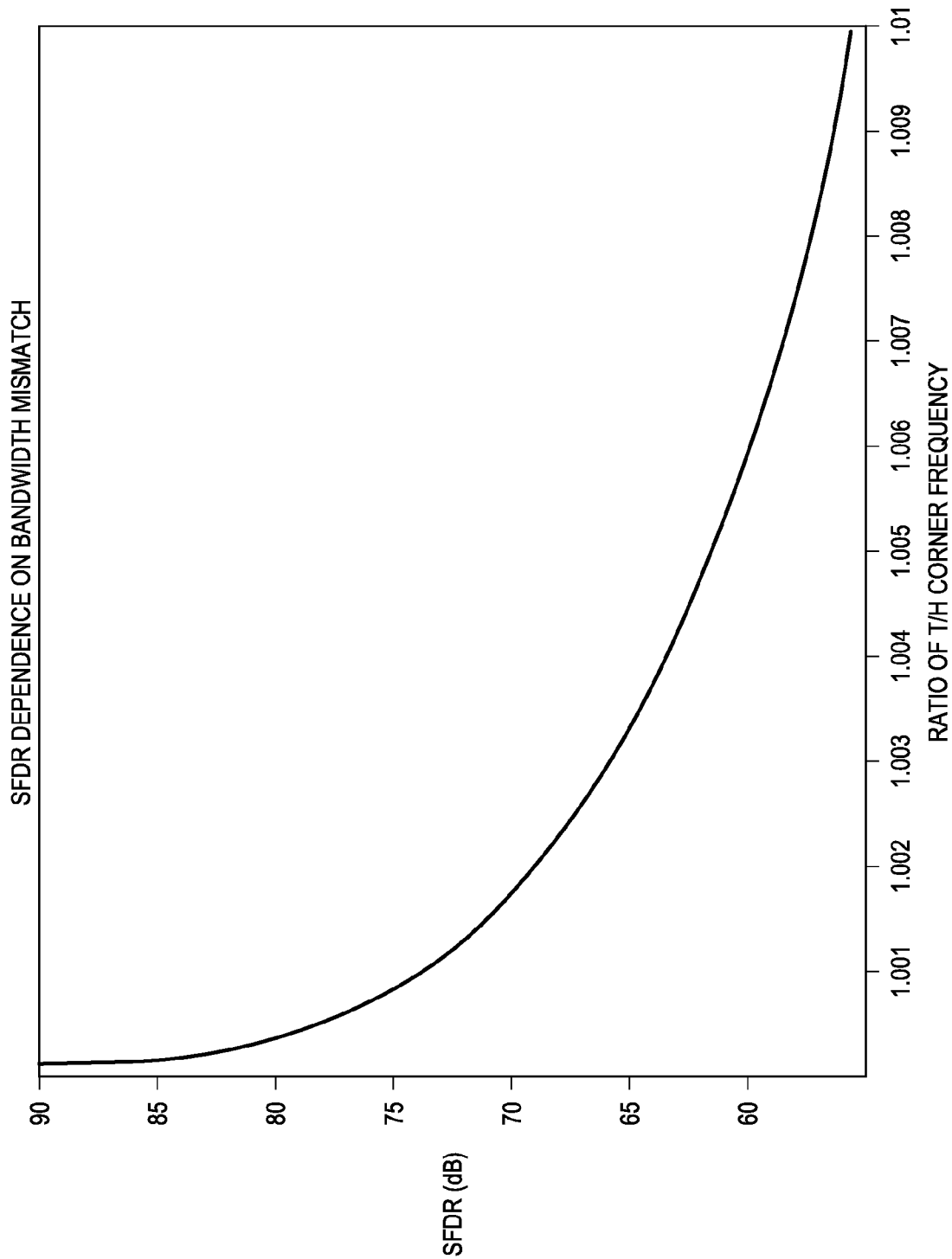
FIG. 3B is an example of a simulation showing the effect of bandwidth mismatch on the Spurious-Free Dynamic Range (SFDR) of a TI ADC.

Refer now to the drawings wherein depicted elements are, for the sake of clarity, not necessarily shown to scale and wherein like or similar elements are designated by the same reference numeral through the several views.

Figure 4:
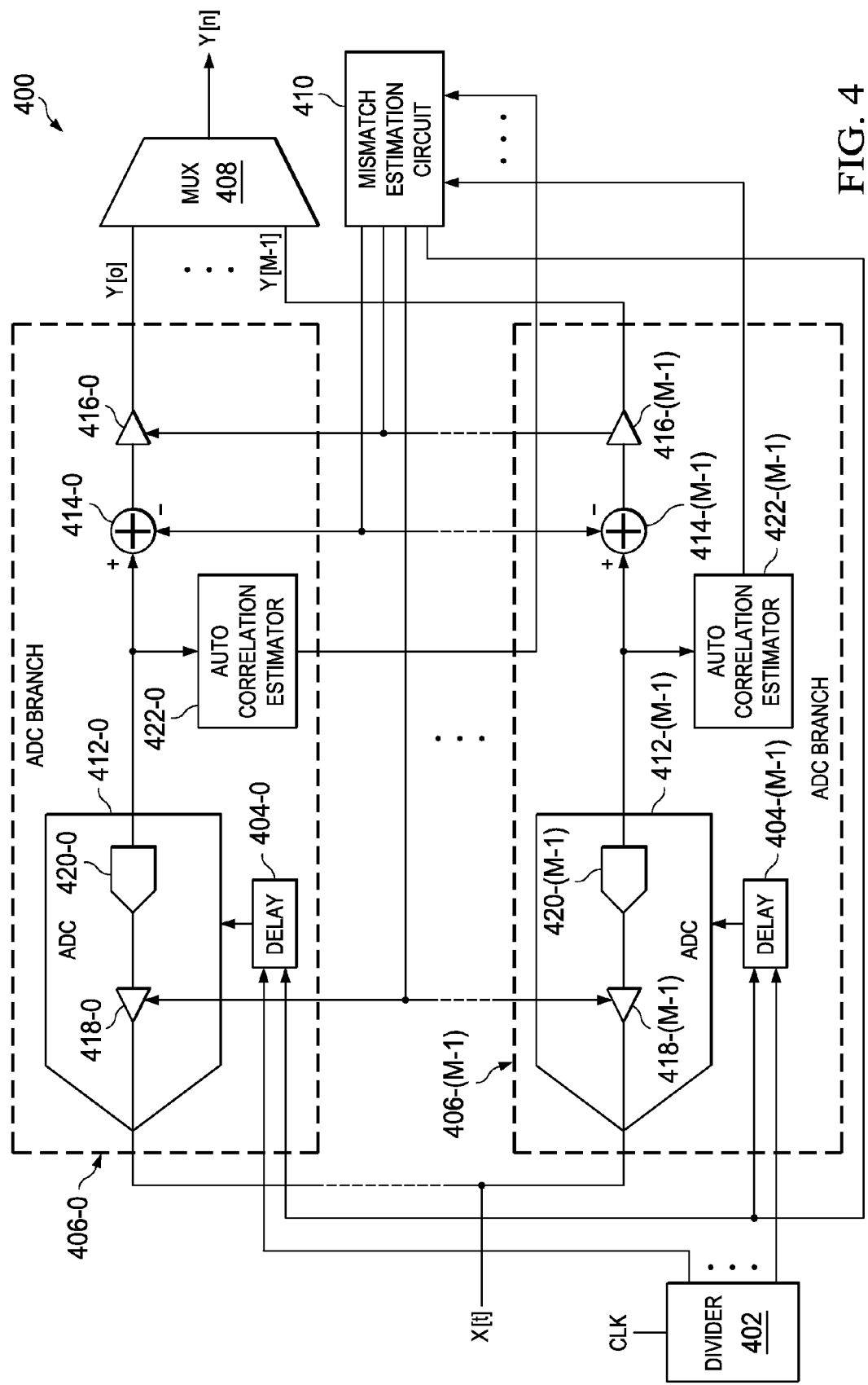
FIG. 4 is a circuit diagram of a TI ADC in accordance with a preferred embodiment of the present invention.

Referring to FIG. 4 of the drawings, the reference numeral 400 generally designates a time-interleaved (TI) analog-to-digital converter (ADC) in accordance with a preferred embodiment of the present invention. ADC 400 generally comprises ADC branches 406-0 to 406-(M−1), divider 402, multiplexer or mux 408, and a mismatch estimation circuit 410. Each ADC branch 406-0 to 406-(M−1) also generally comprises (respectively) ADC 412-0 to 412-(M−1), DC offset circuit 414-0 to 414-(M−1), amplifier 416-0 to 416-(M−1), adjustable delays element 404-0 to 404-(M−1), and autocorrelation estimator 422-0 to 422-(M−1). Additionally, each ADC 412-0 to 412-(M−1) generally comprises (respectively) a track-and-hold (T/H) circuit 418-0 to 418-(M−1) and a sub-ADC 420-0 to 420-(M−1).

In operation, TI ADC 400 converts analog input signal X(t) to a digital signal Y[n]. To accomplish this, divider 402 divides a clock signal CLK (with a frequency of $F_S$ or period of $T_S$) into M clock signals (each with a frequency of $F_S/M$) that are staggered by delay elements 404-0 to 404-(M−1) and provided to ADCs 412-0 to 412-(M−1). This allows each of ADCs 412-0 to 412-(M−1) to convert the analog signal X(t) to digital signals $X_0(k)$ to $X_{M-1}(k)$. The gain and DC offset adjustments are applied to digital signals $X_0(k)$ to $X_{M-1}(k)$ by DC offset circuits 414-0 to 414-(M−1) and amplifiers 416-0 to 416-(M−1) to generate digital signals Y[0] to Y[M−1], which can then be multiplexed by mux 408 to generate a digital signal Y[N].

To generally ensure that signals Y[0] to Y[M−1] are matched, mismatch estimation circuit 410 calculates and compensates for gain mismatches, DC offset mismatches, timing skews, and bandwidth mismatches. The mismatch estimation circuit 410 is generally a digital signals processor (DSP) or dedicated hardware, which determines the gain mismatches, DC offset mismatches, timing skews, and bandwidth mismatches and which can provide adjustments for gain, DC offset, timing skew, and bandwidth to amplifiers 402-0 to 402-(M−1), DC offset circuit 404-0 to 404-(M−1), delays 408-0 to 408-(M−1), and T/H circuits 410-0 to 410-(M−1), respectively.

In general communications systems, signals are generally wide-sense stationary (WSS), which is primarily due to the generally random nature of the transmitted signals. Thus, input signal X(t) can generally be thought of as a WSS signal. As a result, an autocorrelation sequence $R_{aa}$ exists for each of ADC branches 401-0 to 401-(M−1). This autocorrelation sequence $R_{aa}$ for branch "a" is generally a function of the number of ADC branches (M) and the period $T_S$ of clock signal CLK, which can be represented as follows:

$$R_{aa}[lMT_S]=(R_{h_a,h_a}*R_{xx})[lMT_S] \quad (8)$$

Calculation of an estimate ($\hat{R}_{aa}$) of autocorrelation sequence $R_{aa}$ for each branch 406-0 to 406-(M−1) is performed by autocorrelation estimators 422-0 to 422-(M−1), respectively, which is discussed in greater detail below. If the bandwidths of the T/H circuits 410-0 to 410-(M−1) are matched exactly, the autocorrelation sequences $R_{aa}$ for each ADC branch output Y[0] to Y[M−1] should be the equal. To ensure that the bandwidths of the T/H circuits 410-0 to 410-(M−1), the mismatch estimation circuit 410 receives estimations for autocorrelation sequence $\hat{R}_{aa}$ for each ADC branch 401-0 to 401-(M−1) from autocorrelation estimators 422-0 to 422-(M−1) and computes a cost function based on these estimates $\hat{R}_{aa}$. For this arrangement, the cost function is generally "bowl-shaped" or has positive concavity at every point except at a point where the bandwidths are matched (where the concavity approximately equals zero). The expression for the autocorrelation estimate is:

$$\hat{R}_{aa}[lMT_S] = \frac{1}{L}\sum_{k=0}^{L-1} x[kMT_S + a]x[(k-l)MT_S + a] \quad (9)$$

wherein L is the number of products accumulated to estimate the autocorrelation.

One cost function that can be employed is based on normalization and, effectively, eliminates gain from the calculation. This "normalization" cost function uses the squared error between the estimated autocorrelation sequences $\hat{R}_{aa}$ of the first ADC branch 406-0 and the estimated autocorrelation sequences $\hat{R}_{aa}$ for the remaining ADC branches 406-1 to 406-(M−1) that quantifies the extent of the bandwidth mismatch. In particular, the "normalization" cost function is represented as follows:

$$V = \sum_l \left(\frac{\hat{R}_{aa}[lMT_S]}{\hat{R}_{aa}[fMT_S]} - \frac{\hat{R}_{00}[lMT_S]}{\hat{R}_{00}[fMT_S]}\right)^2 \propto \quad (10)$$

$$\sum_l \left(\hat{R}_{aa}[lMT_S]\hat{R}_{00}[fMT_S] - \hat{R}_{00}[lMT_S]\hat{R}_{aa}[fMT_S]\right)^2$$

where f is an arbitrary delay. Therefore, the mismatch estimation circuit 410 can search for a desired bandwidth match by varying the filter characteristics (for example, resistance and capacitance) of each of the T/H circuits 418-0 to 418-(M−1) and looking for a desired range or "minimum" for the cost function of equation (10), essentially looking for the point where the concavity of the cost function of equation (10) is approximately zero.

Alternatively, a cost function that simultaneously compensates for both gain and bandwidth may be employed. In particular, this cost function can be represented as:

$$V = \sum_l |\hat{R}_{aa}[lMT_S] - \hat{R}_{00}[lMT_S]| \quad (11)$$

Here, the mismatch estimation circuit 410 can search for a desired bandwidth match by varying the filter characteristics of each of the T/H circuits 418-0 to 418-(M−1) and the gains of amplifiers 416-0 to 416-(M−1) and looking for a desired range or "minimum" for the cost function of equation (11), essentially looking for the point where the concavity of the cost function of equation (11) is approximately zero. Typically, convergence for equation (11) usually requires more samples than equation (10) because there is increased complexity, but bandwidth matching and gain matching for equation (11) would be greater than equation (10), improving performance.

In the most general case, the cost function can be a distance metric defined on either the estimated autocorrelation sequences directly, or on the sequences generated when all the elements of the autocorrelation sequences are divided by the same element of each sequence. In the case of equation (10), the division is performed using element f of the sequence.

Figure 5:
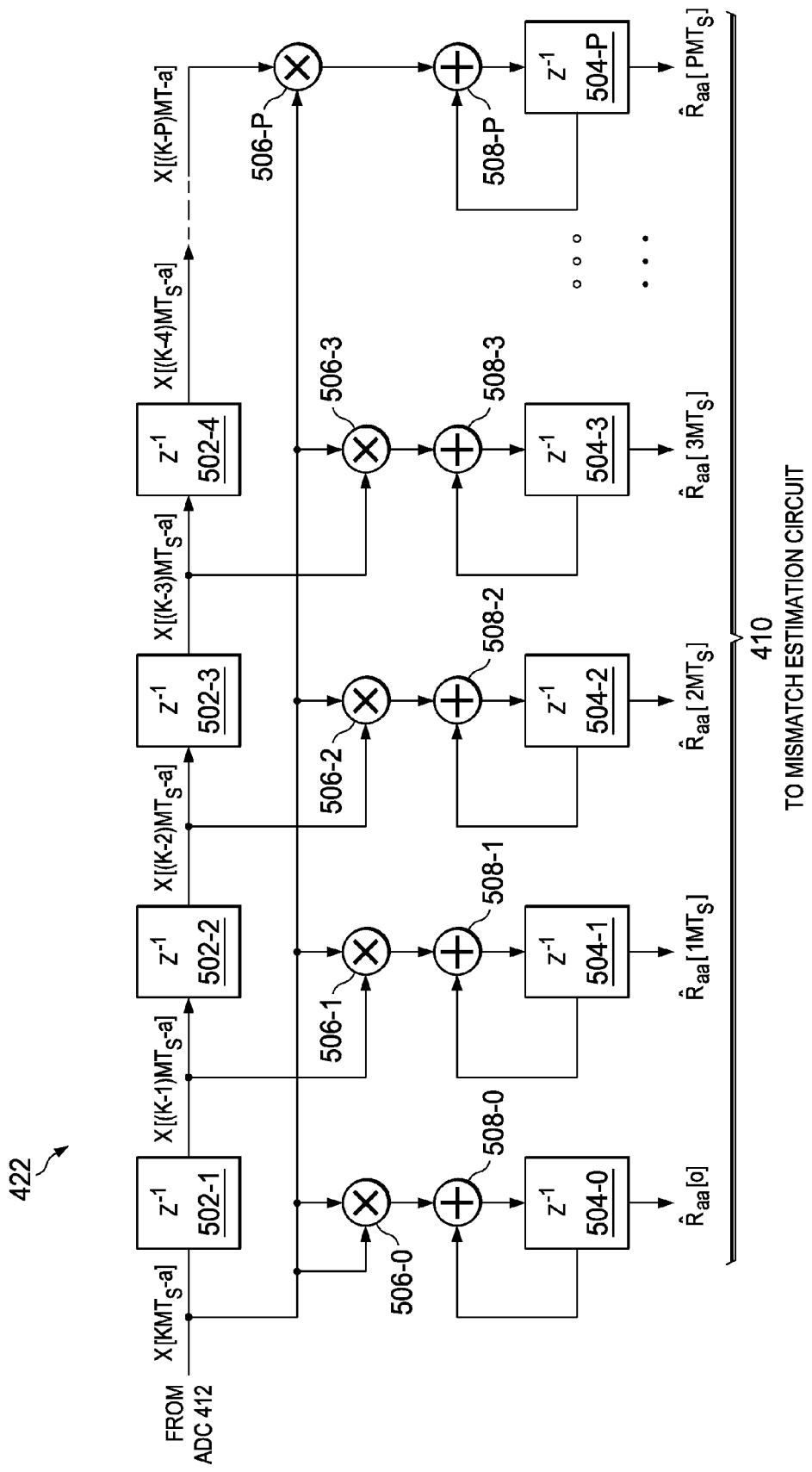
FIG. 5 is a circuit diagram of the autocorrelation estimator of the TI ADC of FIG. 4.
Figure 6A:
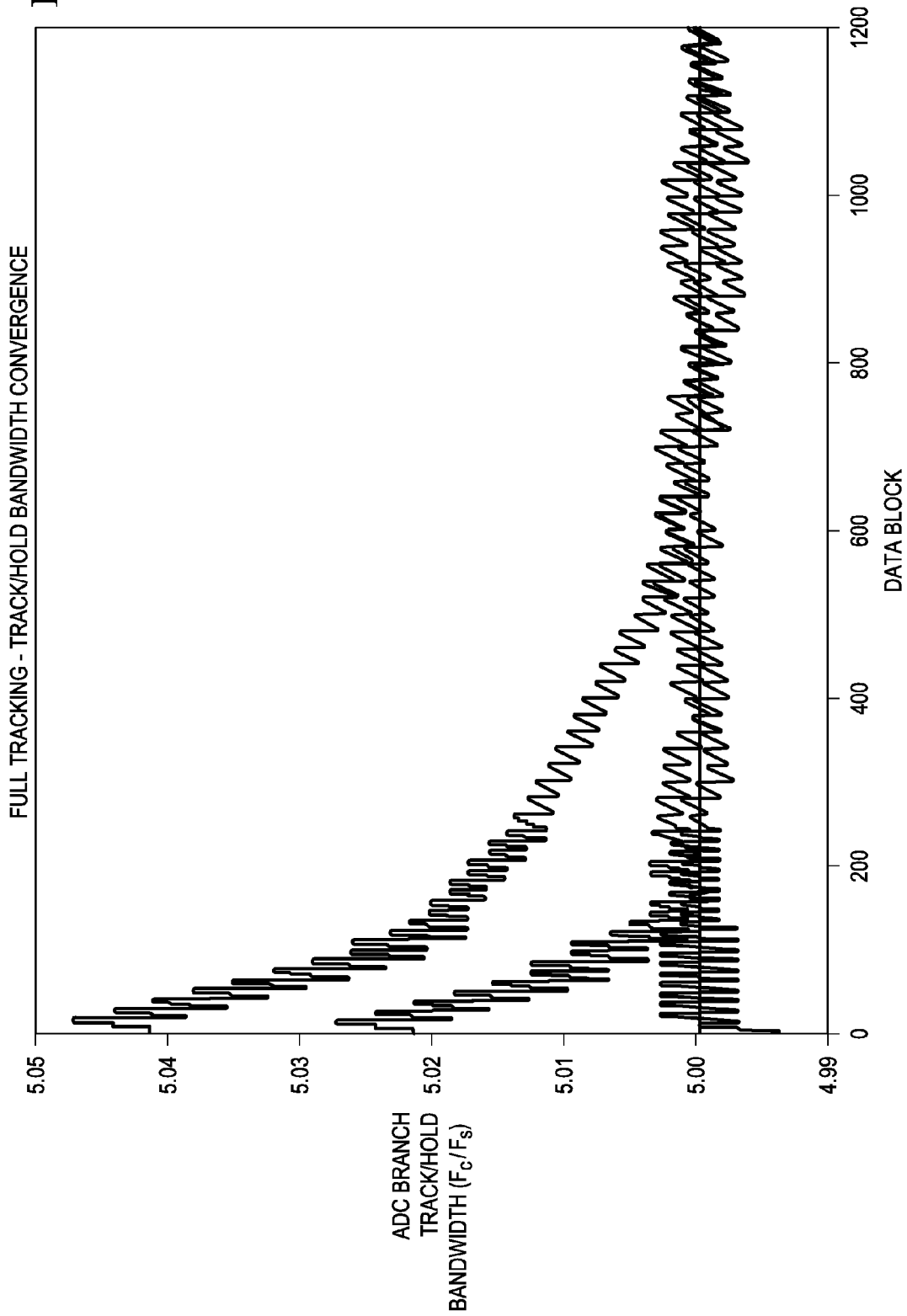
Figure 6C:
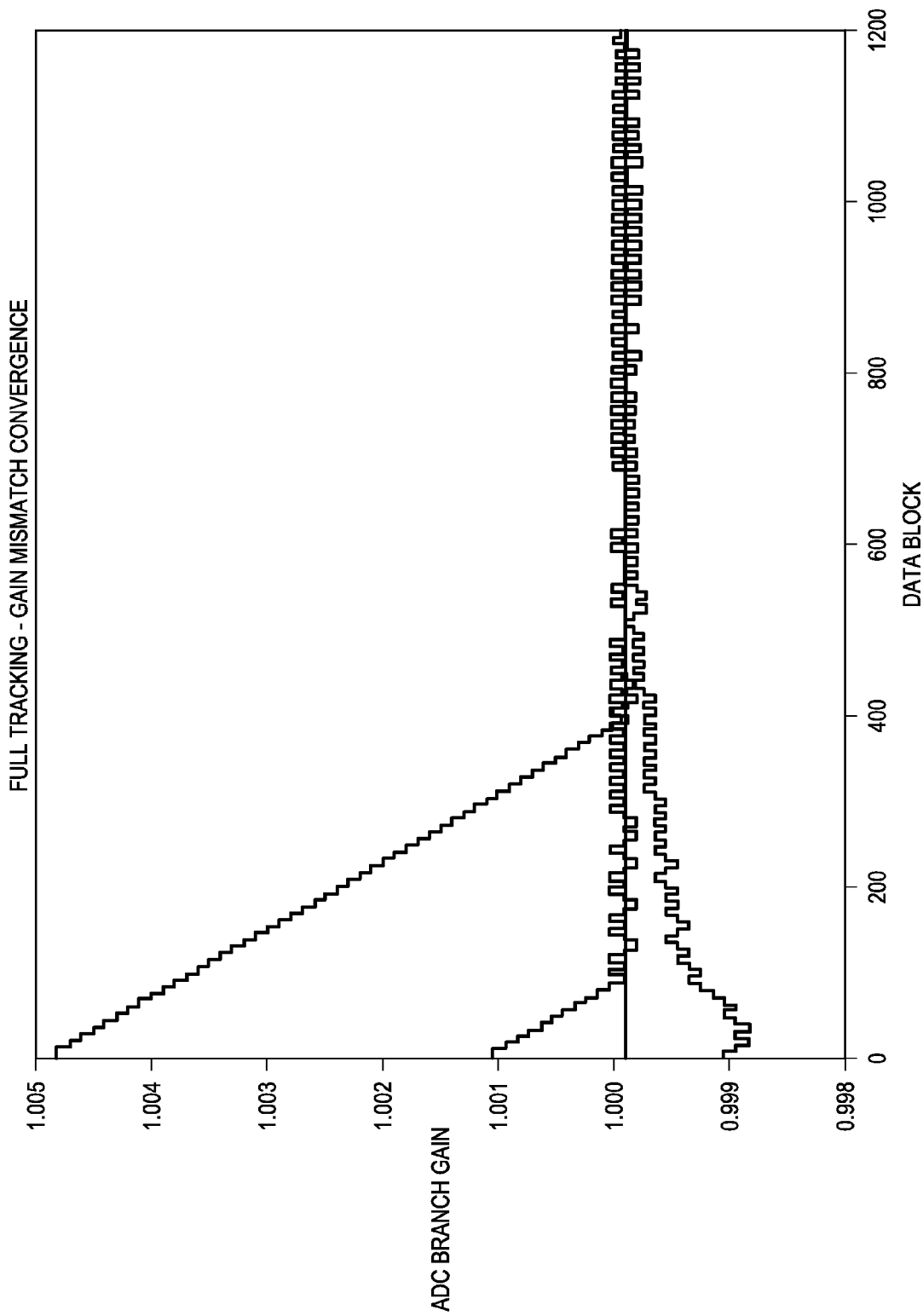
Figure 6D:
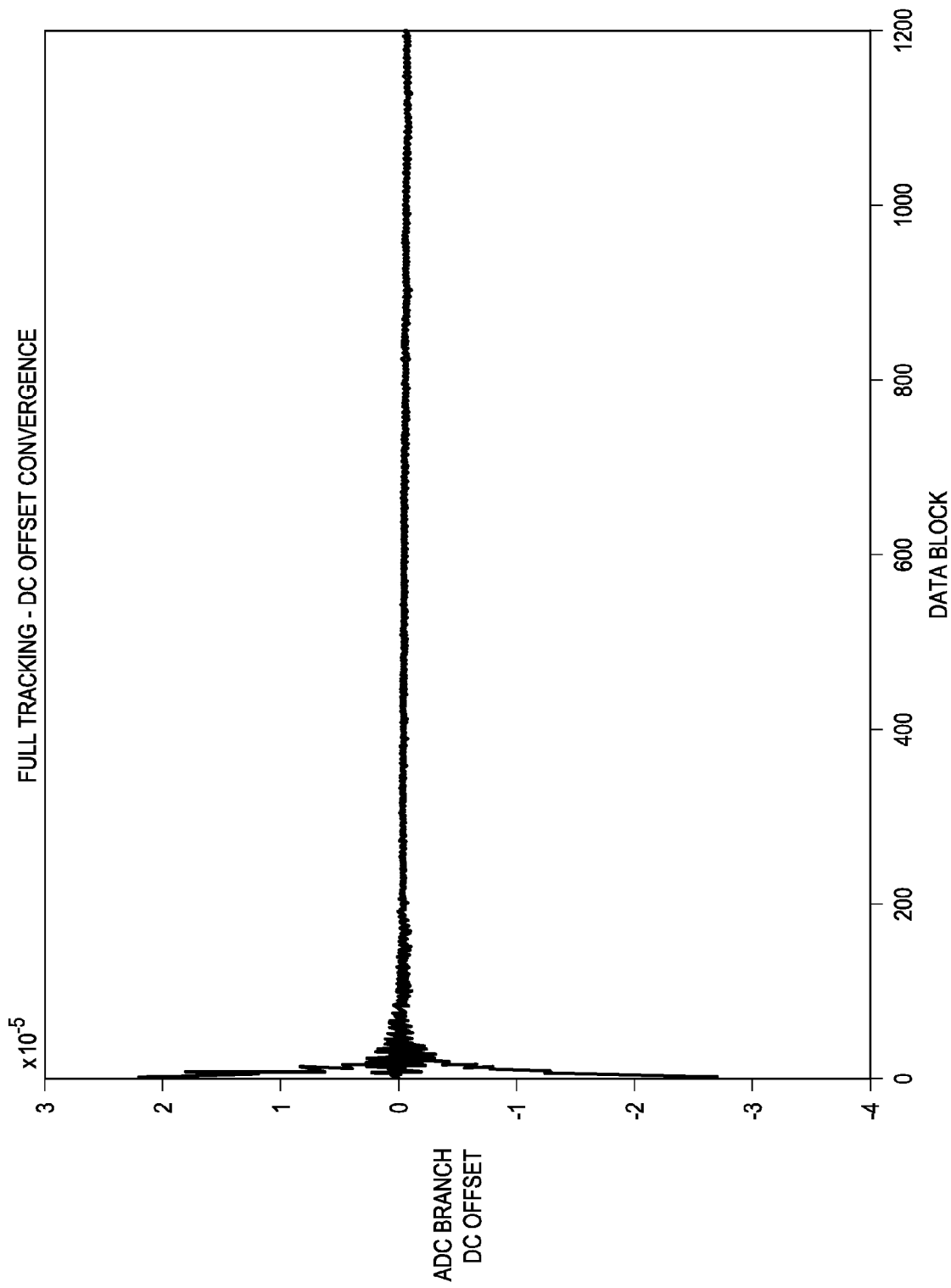

Turning now to FIG. 5, an example of the construction of autocorrelation estimators 422-0 to 422-(M−1) can be seen and which is denoted by reference numeral 422. Autocorrelation estimator 422 generally includes several branches ("p" branches as shown). Each branch calculates an estimation $\hat{R}_{aa}$ (for the $a^{th}$ ADC branch 412-$a$) of the autocorrelation sequence for a sample (0 to $pMT_S$), and each branch is generally comprised of a multiplier 506-0 to 506-$p$, an adder 508-0 to 508-$p$, and a delay element 504-0 to 504-$p$. Delay elements 502-1 to 502-$p$ are generally coupled in series with one another so that samples $X[kMT_S$-a] to $X[(k-p)MT_S$-a] are available for the branches. Each branch uses its multiplier 506-0 to 506-$p$ to multiply its sample $X[kMT_S$-a] to $X[(k-p)MT_S$-a] with the current sample $X[kMT_S$-a]. The output of multiplier 506-0 to 506-$p$ is then added to its previous sum (from delay element 508-0 to 508-$p$) by adder 508-0 to 508-$p$. Looking to branch "1" for example, multiplier 506-1 multiples sample $X[kMT_S$-a] with sample $X[(k-1)MT_S$-a], and adder 508-1 adds the output of multiplier ($X[kMT_S$-a] $X[(k-1)MT_S$-a]) with the previous sum from adder 508-1 to generate the autocorrelation sequence estimate $\hat{R}_{aa}[MT_S]$ for branch "1."

Referring now to FIGS. 6A through 6D, an example of the operation of TI ADC 400 can be seen. In particular, FIGS. 6A through 6D show the convergence for bandwidth, timing skew, gain, and DC offset (respectively) substantially simultaneously at about 600 data blocks (with a data block sample size $2^{18}$ samples) for a three tone signal at $0.27F_S$, $0.35F_S$, and $-0.27F_S$. Clearly, the TI ADC 400 now provides a structure that allows for the construction of a high speed, high resolution ADC that was previously unachievable.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a plurality of analog-to-digital converters (ADCs) that each receive an analog input signal and that each generate a digital output signal, wherein each ADC includes a track-and-hold (T/H) circuit with filter characteristics;
   a multiplexer that is coupled to receive the digital output signal from each ADC;
   a timing circuit that is coupled to each ADC so as to interleave the plurality of ADCs; and
   a mismatch compensator that is coupled to each ADC so as to compensate for a bandwidth mismatch between the plurality of ADCs by adjusting the filter characteristics of the T/H circuit for at least one of the plurality of ADCs.

2. The apparatus of claim 1, wherein the mismatch compensator further comprises:
   a plurality of autocorrelation estimators, wherein each autocorrelation estimator is associated with at least one of the plurality of ADCs; and
   a mismatch estimation circuit that is coupled to each autocorrelation estimator and the T/H circuit for each ADC.

3. The apparatus of claim 2, wherein the mismatch compensator compensates for gain mismatch between the plurality of ADC and compensates for offset mismatch between the ADCs.

4. The apparatus of claim 3, wherein the timing circuit further comprises:
   a divider; and
   a plurality of delay circuits, wherein each delay circuit is coupled to the divider and is associated with at least one of the ADCs.

5. The apparatus of claim 4, wherein the mismatch compensator compensates for timing skew between the ADCs by adjusting at least one of the plurality of delay circuits.

6. The apparatus of claim 5, wherein the each autocorrelation estimator generates an autocorrelation sequence, and wherein the mismatch estimation circuit uses the autocorrelation sequence from each autocorrelation estimator in a cost function to compensate for the bandwidth mismatch.

7. An apparatus comprising:
   a plurality of ADCs that each receive an analog input signal and that each generate a digital output signal, wherein each ADC includes a T/H circuit with filter characteristics;
   a plurality of autocorrelation estimators, wherein each autocorrelation includes:
      a delay line having an input that is coupled to receive the digital output signal from at least one of the ADCs, wherein the delay line has a plurality of taps;
      a plurality of estimation circuits that are coupled to the delay line in a sequence, wherein the first estimation circuit of the sequence is coupled to the input of the delay line, and wherein each of the remaining estimation circuits of the sequence is coupled to the input of the delay line and to at least one of the taps of the delay line;
   a multiplexer that is coupled to receive the digital output signal from each ADC;
   a timing circuit that is coupled to each ADC so as to interleave the plurality of ADCs; and
   a mismatch estimation circuit that is coupled to each autocorrelation estimators and the T/H circuit for each ADC, wherein the mismatch estimation circuit compensates for a bandwidth mismatch between the plurality of ADCs by adjusting the filter characteristics of the T/H circuit for at least one of the plurality of ADCs.

8. The apparatus of claim 7, wherein each estimation circuit further comprises:
   a multiplier that is coupled to the delay line;
   an adder that is coupled to the multiplier; and
   a delay circuit that is coupled to adder.

9. The apparatus of claim 8, wherein the mismatch estimation circuit compensates for gain mismatch between the plurality of ADC and compensates for offset mismatch between the ADCs.

10. The apparatus of claim 7, wherein the timing circuit further comprises:
    a divider; and
    a plurality of delay circuits, wherein each delay circuit is coupled to the divider and is associated with at least one of the ADCs.

11. The apparatus of claim 10, wherein the mismatch compensator compensates for timing skew between the ADCs by adjusting at least one of the plurality of delay circuits.

12. A method comprising:
    converting a plurality of samples from an analog input signal into a digital signal by a plurality of interleaved ADCs, wherein each ADC includes a T/H circuit having filter characteristics;
    generating an autocorrelation sequence for each ADC from the digital signal; and
    adjusting the filter characteristics for the T/H circuit of at least one of the ADCs to compensate for a bandwidth mismatch between the plurality of ADCs based at least in part on minimization of a cost function of the autocorrelation sequence for each ADC.

13. The method of claim 12, wherein the method further comprises adjusting a timing for at least one of the ADCs to compensate for timing skew between the plurality of ADCs.

\* \* \* \* \*